United States Patent [19]

Banks et al.

[11] Patent Number: 5,112,440

[45] Date of Patent: May 12, 1992

[54] METHOD FOR MAKING METALLIC PATTERNS

[75] Inventors: Christopher P. Banks, Saffron Walden; Edward Irving, Higher Whitley, both of England

[73] Assignee: Ciba-Geigy Corporation, Ardsley, N.Y.

[21] Appl. No.: 601,162

[22] Filed: Oct. 22, 1990

[30] Foreign Application Priority Data

Oct. 26, 1989 [GB] United Kingdom ............... 8924142

[51] Int. Cl.$^5$ ........................... B44C 1/22; C23F 1/02
[52] U.S. Cl. .................. 156/659.1; 156/656; 156/902; 156/668; 156/652; 430/318; 430/329
[58] Field of Search ............ 156/650, 652, 656, 659.1, 156/661.1, 666, 668, 901, 902; 430/313, 314, 318, 329; 427/96; 29/846, 847

[56] References Cited

U.S. PATENT DOCUMENTS 4,746,399  5/1988  Demmer et al. ................ 156/656

Primary Examiner—William A. Powell
Attorney, Agent, or Firm—JoAnn Villamizar

[57] ABSTRACT

The present invention provides a method for making a metallic pattern on a substrate having a surface comprising bare metal in predetermined areas and metal coated by a resist in remaining areas which comprises (i) protecting the bare metal by coating with a film-forming resin, (ii) removing any film-forming resin from the resist, (iii) removing the resist from said remaining areas using a solvent which will not remove the film-forming resin, thereby exposing metal in said remaining areas, (iv) etching the metal exposed in (iii) using an etchant which does not remove the film-forming resin and (v) removing the film-forming resin with a suitable solvent.

20 Claims, No Drawings

METHOD FOR MAKING METALLIC PATTERNS

The present invention relates to a method for making metallic patterns such as printed circuits and the like.

There are numerous methods used for the manufacture of printed circuit boards, although some of the steps used are common to the various methods.

In the case of single sided printed circuit boards, the board, comprising a copper clad base laminate, has holes drilled where desired, a resist is coated on the copper in a predetermined pattern, using screen printing or photoimaging techniques, to give a board having bare copper in some areas and copper coated by the resist in remaining areas, the bare copper is then plated with a tin-lead alloy, which is finally removed using a tin-lead alloy stripper.

In the case of double sided, plated through hole printed circuit boards, the procedure is similar, but with the following additional steps: after the holes are drilled the board is subjected to electroless copper deposition to deposit copper on the surface of the holes (as well as over all the copper); and after applying the resist in a predetermined pattern the board is subjected to copper electroplating to deposit copper on the bare copper parts including the surface of the holes.

Disadvantages of these processes are the high cost of the tin-lead alloy stripper and the necessary subsequent cleaning; and the tin-lead stripper (usually a mixture of hydrogen peroxide and sulphuric acid) is aggressive to the boards themselves and to personnel and equipment used in carrying out the stripping.

U.S. Pat. No. 4,746,399 a method is described in which the copper left bare after applying the resist is protected by electrodeposition of an electrodepositable resin that is strippable by a different solvent from that used to strip the resist, and which is not removed by the copper etchant.

We have now surprisingly found that the copper left bare after applying the resist can be protected by simply coating it with a film-forming resin without the use of any electric voltage, provided that the film-forming resin is resistant to the solvent used to remove the resist (usually an aqueous base).

Accordingly the present invention provides a method for making a metallic pattern on a substrate having a surface comprising bare metal in predetermined areas and metal coated by a resist in remaining areas which comprises (i) protecting the bare metal by coating with a film forming resin, (ii) removing any film-forming resin from the resist, (iii) removing the resist from said remaining areas using a solvent which will not remove the film-forming resin, thereby exposing metal in said remaining areas, (iv) etching the metal exposed in (iii) using an etchant which does not remove the film-forming resin, and (iv) removing the film-forming resin with a suitable solvent.

The resist may be an epoxide resin applied by a screen printing process and then cured. Preferably, the resist is a photoresist coated in selected areas by applying it uniformly to the substrate, which is usually a copper-clad laminate, subjecting it to actinic radiation, in a predetermined pattern and then removing exposed or unexposed areas according to whether the photoresist is positive or negative respectively. Positive and negative photoresists for use in making printed circuit boards are well known materials and any of them may be used. They can be strippable under aqueous conditions or by means of an organic solvent. A layer of another metal such as nickel may be deposited on bare copper areas before coating with the film-forming resin.

The film-forming resin may be base-strippable or acid-strippable or strippable by an organic solvent respectively.

A particular preferred combination is the use of a photoresist which is strippable under aqueous conditions and film-forming resin which is strippable by means of an organic solvent.

Any of the large number of film-forming resins may be used including acrylic resins; epoxide resins; adducts of epoxide resins with amines or polycarboxylic, amino or mercapto acids; polyurethanes; polyesters; and reaction products of phenolic hydroxyl group-containing resins with an aldehyde and amine or amino- or mercapto-carboxylic acids. Suitable acrylic resins include copolymers of at least one acrylic ester such as an alkyl or hydroxyalkyl acrylate or methacrylate with an ethylenically unsaturated monomer. Suitable epoxide resin adducts include those of diglycidyl ethers of dihydric alcohols or bisphenols with a stoichiometric excess of a primary or secondary monoamine or polyamine such as ethanolamine, diethanolamine or ethylenediamine, a polycarboxylic acid such as glutaric or adipic acid, a polycarboxylic acid anhydride such as maleic or succinic anhydride, an aminocarboxylic acid such as o-, m- or p-aminobenzoic acid or a mercaptocarboxylic acid. Suitable polyurethanes include adducts of hydroxyl-terminated polyurethanes with polycarboxylic acid anhydrides. Suitable polyesters include carboxyl-terminated polyesters derived from polyhydric alcohols such as ethylene glycol, 1,2-propylene glycol, 1,3-propylene glycol or butane-1,4-diol with polycarboxylic acids such as glutaric, adipic, maleic, tetrahydrophthalic and phthalic acids or esterifying derivatives thereof. Suitable reaction products of phenolic hydroxyl-containing resins include reaction products of phenol-terminated adducts of diglycidyl ethers with bisphenols, aldehydes such as formaldehyde or benzaldehyde and amines such as ethanolamine, diethanolamine or ethylene diamine, aminocarboxylic acids such as glycine, sarcosine or aspartic acid, or mercaptocarboxylic acids such as thioglycolic or 3-mercaptopropionic acid.

Preferred film-forming resins are copolymers of at least one monoacrylic ester, particularly selected from methyl acrylate, ethyl acrylate, 2-hydroxyethyl acrylate, 2-hydroxypropyl acrylate, butyl acrylate, ethylhexyl acrylate and the corresponding methacrylates, with at least one monoacrylic monomer containing a carboxyl or tertiary amino group, particularly acrylic acid, methacrylic acid or dimethylaminoethyl methacrylate and, optionally, with a further vinyl monomer such as styrene. Other preferred electrodepositable resins are adducts of a diglycidyl ether of a bisphenol, particularly, bisphenol A, which may have been advanced, with a monoamine, particularly diethanolamine.

The amount of film-forming resin needs to be sufficient to cover the exposed metal completely and protect it during removal of the photoresist and during etching of the metal thereby exposed.

The film-forming resin can be applied by any suitable method such as dipping, rolling, brushing or spraying. The resin may be applied from aqueous medium, from organic solvent or applied neat. These methods usually cover the whole board. After the resin has been applied, excess is removed e.g. by wiping such as with a glass rod, or by passing the board through rollers. As the resist stands proud of the otherwise exposed copper, the film-forming resin is removed from the resist, but still coats the copper. The film-forming resin may then be simply dried before further processing or it may be heat or light cured to improve its chemical resistance.

When an organic solvent is used to remove the resist, a suitable solvent which does not dissolve the film-forming resin can be found by routine experimentation. Both this solvent and the solvent used to remove the film-forming resin can be selected from halohydrocarbons such as 1,1,1-trichloroethane and dichloromethane, hydroxylic solvents such as 2-n-butoxyethanol and 2-ethoxyethanol, esters such as 2-ethoxyethyl acetate, ketones such as acetone and methyl ethyl ketone and ethers such as tetrahydrofuran. Where, for example, the film-forming resin is derived from an epoxy resin and the resist is an acrylic material, the resist can be removed using a halohydrocarbon solvent and the film-forming resin can be removed using a ketone.

The metal exposed by removal of the resist, usually copper, may be removed by any well known etchant such as ferric chloride, hydrogen peroxide/phosphoric acid, ammonium persulphate or cupric chloride.

If desired the film-forming resin can be left in place while the board is coated with a further resist, such as a solder mask, in a predetermined pattern, which coating is conventionally used to treat boards made by conventional processes to shield areas of the metallic pattern which are not to be soldered to other components, followed by removal of electrodeposited resin only from areas where bare copper is required for subsequent application of solder for the connection of components to the printed circuit. Thus, such a process avoids the necessity to remove all of the film-forming resin. When the solder mask is a photosensitive material applied to the board in a predetermined pattern by an imaging process, the film-forming resin can be removed from the required areas by the solvent treatment used for image development, thereby avoiding the necessity for a separate step to remove the film-forming resin in the manufacturing process. Furthermore, the film-forming resin remaining beneath the solder mask serves to facilitate good adhesion between the underlying copper and the solder mask.

Accordingly, the present invention also provides a method of making a metallic pattern on a substrate having a surface comprising bare metal in predetermined areas and metal coated by a first resist in remaining areas which comprises (i) protecting the bare metal by coating with a film-forming resin, (ii) removing any film-forming resin from the first resist, (iii) removing the first resist from said remaining areas using a solvent which does not remove the film-forming resin, (iv) etching the metal exposed in (iii) using an etchant which does not remove the film-forming resin, (v) forming a layer of a second resist in a predetermined pattern over the film-forming resin, thereby leaving areas of the film-forming resin film uncovered by the resist, and (vi) removing the uncovered areas of the film-forming resin by treatment with a solvent therefor.

After the etching, a layer of a resist to act, for example, as a solder mask is formed in a predetermined pattern over the film-forming resin and, usually, also over areas etched in step (iv). It will be appreciated that it is not strictly necessary to have solder mask in areas which are devoid of metal after step (iv). However, in practice, it is usually more convenient to have the solder mask in these areas. The pattern formation of step (v) can be effected by applying a curable, preferably photocurable, resin composition directly in a predetermined pattern using a screen printing technique and curing the composition, preferably by irradiating the screen printed layer. Photocurable resin compositions which can be applied by screen printing are well known to those skilled in the art of making printed circuit boards. The photocurable resins can be, for example, resins containing polymerisable acrylate or methacrylate ester groups used together with free radical-generating photoinitiators therefor, epoxy resins used together with cationic photoinitiators therefor such as onium salts, and resins containing directly activated photosensitive groups such as cinnamate, chalcone, phenylpentadienone and similar groups.

Preferably, step (v) is affected by (a) applying a layer of a photoresist over the film-forming resin, (b) irradiating the photoresist layer in a predetermined pattern, thereby effecting a difference in solubility between exposed and unexposed parts of the layer, and (c) removing more soluble areas of the irradiated layer by treatment with a solvent.

In step (a), the photoresist is usually applied over substantially all of the surface of the substrate, that is over areas etched in step (iv) as well as over the film-forming resin. Positive and negative photoresists are suitable. They may be liquid polymerisable photoresists or solid photoresists which may be applied to the substrate as preformed films, as powders which are melted to form liquid layers and then cooled to form films, or as solutions in solvents, which are then evaporated to form photoresist films. Thus negative photoresists suitable for use in step (v) (a) include well known photocurable resin compositions such as those comprising resins containing directly activated photosensitive groups, for example those having azido, coumarin, stilbene, maleimido, pyridinone or anthracene groups or, preferably, those containing alpha, beta-ethylenically unsaturated ester or ketone groups having aromaticity or ethylenic unsaturation in conjugation with the alpha, beta-unsaturation, such as cinnamate, sorbate, chalcone, phenyl-substituted propenone and phenyl-substituted pentadienone groups. Resins containing such photosensitive groups are described in U.S. Pat. No. 4,572,890.

Other photocurable resin compositions suitable for use as the photoresist in step (v) (a) include those comprising a cationically polymerisable material, particularly an epoxide resin or a vinyl ether, together with a cationic photoinitiator therefor, particularly a metallocenium salt, an onium salt or an aromatic iodosyl salt. Photocurable compositions of this type are also described in U.S. Pat. No. 4,572,890 and in EP-A-0094915.

Further photocurable resin compositions suitable for use as the photoresist in step (v) (a) include those comprising a free-radical-polymerisable unsaturated material, particularly an acrylate or methacrylate, together with a free radical-generating photoinitiator therefor. Many acrylic, that is acrylate or methacrylate group-containing, photocurable compositions of this type are available commercially.

Other negative photoresists suitable for use in step (v) (a) include those comprising a substance, or mixture of substances, containing an acrylate or methacrylate group and a directly activated photosensitive group such as hereinbefore described, together with a free radical-generating photoinitiator for the acrylate or methacrylate group. Such photoresists are described in U.S. Pat. Nos. 4,413,052 and 4,416,975 and in European Patent Publication EP-A-0207893.

Positive photoresists suitable for use as the photoresist in step (v) (a) include those comprising polyoxymethylene polymers described in U.S. Pat. No. 3,991,033; the o-nitrocarbinol esters described in U.S. Pat. No. 3,849,137; the o-nitrophenyl acetals, their polyesters, and end-capped derivatives described in U.S. Pat. No. 4,086,210; sulphonate esters of aromatic alcohols containing a carbonyl group in a position alpha or beta to the sulphonate ester group, or N-sulphonyloxy derivatives of an aromatic amide or imide, such as esters and imides described in U.S. Pat. No. 4,618,564; aromatic oxime sulphonates, such as those described in EP-A-0199672; quinone diazides such as quinone-diazide-modified phenolic resins; and resins containing benzoin groups in the chain, such as those described in U.S. Pat. No. 4,368,253.

The photoresist may include conventional photosensitisers and non-photosensitive film-forming polymers such as those used in conventional photoresists.

Preferred photoresists for use in step (v) (a) are negative photoresists, particularly useful such resists being those which are suitable as solder masks.

Irradiation of the photoresist layer in a predetermined pattern in step (v) (b) may be achieved by exposure through an image-bearing transparency consisting of substantially opaque and substantially transparent areas, or by means of a computer-controlled laser beam. Electromagnetic radiation having a wavelength of 200–600 nm is generally used, and suitable sources include carbon arcs, mercury vapour arcs, fluorescent lamps with phosphors emitting ultra violet light, argon and xenon glow lamps, tungsten lamps, and photographic flood lamps; of these, mercury vapour arcs and metal halide lamps are the most suitable. The exposure time required depends on such factors as the nature and thickness of the components of the photoresist layer, the type of radiation source, and its distance from the solder mask. Suitable exposure times can readily be found by routine experimentation.

Removal of more soluble areas of the irradiated layer in step (v) (c) is effected by treatment with a solvent chosen according to the nature of the photoresist, and may be water, an aqueous or aqueous organic solution of an acid or base or an organic solvent or mixture of solvents. Suitable acid solutions include those of acetic, lactic, glycolic or toluene-p-sulphonic acids, while suitable basic solutions include those of sodium or potassium hydroxide or carbonate. Suitable organic solvents include hydrocarbons such as toluene and xylene, halohydrocarbons such as 1,1,1-trichloroethane and dichloromethane, hydroxylic solvents such as ethanol, 2-n-butoxyethanol and 2-ethoxyethanol, esters such as 2-ethoxyethyl acetate, ketones such as cyclohexanone, acetone and methyl ethyl ketone and ethers such as tetrahydrofuran.

When the photoresist used in step (v) (a) is a negative photoresist, areas not exposed to radiation in step (v) (b) are removed by treatment with solvent in step (v) (c). When a positive photoresist is used in step (v) (a), usually areas exposed to radiation in step (v) (b) are removed in step (v) (c), although if an image reversal process is used, for instance with a quinone diazide photoresist, the areas initially exposed to radiation are subsequently rendered less soluble than the other areas so that it is the areas not exposed in step (v) (b) which are removed in (v) (c).

The solvent used to remove uncovered areas of the film in step (vi) can be selected from the same group of solvents hereinbefore specified for removal of the photoresist in step (v) (c). The removal of the uncovered film can be effected in a separate step from (v) (c). In preferred embodiments of the process of the invention, the removal (vi) of the film is effected by the solvent treatment (v) (c). A suitable solvent can be found by routine experimentation.

In particularly preferred embodiments of the process of the invention, in which the first resist is removed by aqueous solvents, the second resist is removed by means of an organic solvent, and the film-forming resin is removed by means of an organic solvent used to remove the second resist.

The invention is illustrated by the following Examples in which parts are parts by weight. The resins used in the Examples are:

Resin I: A monomer mixture consisting of styrene (47.5 parts), 2-ethylhexyl acrylate (25 parts), 2-hydroxyethyl methacrylate (20 parts) and 2-(dimethylamino)ethyl methacrylate (7.5 parts) with azobis(isobutyronitrile) (1.5 parts) is added dropwise over 2 hours to 2-n-butoxyethanol (50 parts) stirred at 100° C. The reaction mixture is maintained at 100° C. for a further 1 hour and a further charge of azobis(isobutyronitrile) (0.5 part) and 2-n-butoxyethanol (5.5 parts) is added. This procedure, namely heating at 100° C. for 1 hour then adding a further charge, is repeated twice more and the reaction mixture is held at 100° C. for a further hour and then cooled to room temperature. 2-n-Butoxyethanol (8 parts), technical 2,4-tolylenediisocyanate which has been half-blocked with methylethylketoxime (12 parts) and di-n-butyltindilaurate (0.16 part) are added. The reaction mixture is stirred at 50° C. for 16 hours and then cooled to ambient temperature. The number average molecular weight of the copolymer is 12,600 and its amine value is 0.25 eq/kg.

Resin II: A monomer mixture consisting of styrene (47.5 parts), 2-ethylhexyl acrylate (25 parts), 2-hydroxyethyl methacrylate (20 parts) and 2-(dimethylamino)ethyl methacrylate (7.5 parts) with azobis(isobutyronitrile) (1.5 parts) is added dropwise over 2 hours to 2-n-butoxyethanol (50 parts) stirred at 100° C. The reaction mixture is maintained at 100° C. for a further 1 hour and a further charge of azobis(isobutyronitrile) (0.5 part) and 2-n-butoxyethanol (5.5 parts) is added. This procedure, namely heating at 100° C. for 1 hour then adding a further charge, is repeated twice more and the reaction mixture is held at 100° C. for a further hour and then cooled to ambient temperature. The amine value of the resulting copolymer solution is 0.28 eq/kg and the number average molecular weight of the copolymer is 10,416.

Resin III: This denotes a solid, Bisphenol A based epoxy resin with an epoxide content of 1.7 mol/kg.

Resin IV: A solid, Bisphenol A based epoxy resin of epoxide content 1.2 mol/kg (50 parts) is dissolved in 2-n-butoxyethanol (50 parts) at 120° C. A mixture of diethanolamine (4.2 parts) and di-n-butylamine (2.2 parts) is added dropwise over 10 minutes. It is then heated at 120° C. for 3 hours by which time the epoxide content is neglgible. It is then cooled to ambient temperature.

Resin V: This denotes Versamid 100 (a semi-solid polyamide based on dimerised fatty acids and polyamines).

Resin VI: This denotes 3,4-epoxycyclohexylmethyl-3',4'-epoxycyclohexane carboxylate.

Resin VII: A monomer mixture consisting of styrene (60 parts), 2-ethylhexyl acrylate (27.5 parts), 2-hydroxyethyl methacrylate (7.5 parts) and 2-(dimethylamino)ethyl methacrylate (5 parts) with azobis(isobutyronitrile) (1.5 parts) is added dropwise over 2 hours to toluene (50 parts) stirred at 100° C. The reaction mixture is maintained at 100° C. for a further 1 hour and a further charge of azobis(isobutyronitrile) (0.5 part) and toluene (5.5 parts) is added. This procedure, namely heating at 100° C. for 1 hour then adding a further charge, is repeated twice more and the reaction mixture is held at 100° C. for a further hour and then cooled to ambient temperature. The amine value of the resulting copolymer solution is 0.28 eq/kg.

Resin VIII: A monomer mixture consisting of styrene (60 parts), 2-ethylhexyl acrylate (27.5 parts), 2-hydroxyethyl methacrylate (7.5 parts) and dimethylaminoethyl methacrylate (5 parts) with azobis(isobutyronitrile) (1.5 parts) is added dropwise over 2 hours to 2-n-butoxyethanol (50 parts) stirred at 120° C. for a further hour and a further charge of azobis(isobutyronitrile) (0.5 part) and 2-n-butoxyethanol (5.5 parts) added. This procedure - maintenance at 120° C. for one hour followed by addition of the further charge - is repeated twice more and the reaction mixture held at 120° C. for a further hour and then cooled. The copolymer in the resulting solution has a number average molecular weight of 10,279, the solution having an amine content of 0.19 equiv/kg.

Resin IX: This denotes a polyimide based on 3,3',4,4'-benzophenonetetracarboxylicidianhydride and 5(6)-amino-1-(4'-aminophenyl)-1,3,3-trimethylindane.

Resin X: This denotes a methylated melamine - formaldehyde resin (substantially hexamethoxymethyl melamine).

Resin XI: This denotes a 60% solution of a phenol-formaldehyde novolak in methanol.

Resin XII: A monomer mixture consisting of methyl methacrylate (45 parts), butyl acrylate (47.5 parts) and (2-dimethylamino)ethyl methacrylate (7.5 parts) with azobis(isobutyronitrile) (1.5 parts) is added dropwise over 2 hours to 2-n-butoxyethanol (50 parts) stirred at 100° C. The reaction mixture is maintained at 100° C. for a further 1 hour and a further charge of azobis(isobutyronitrile) (0.5 part) and 2-n-butoxyethanol (5.5 parts) is added. This procedure, namely heating at 100° C. for 1 hour then adding a further charge, is repeated twice more and the reaction mixture is held at 100° C. for a further hour and then cooled to ambient temperature. The amine value of the resulting copolymer solution is 0.28 eq/kg.

Resin XIII: This denotes a 70% solids solution in butanol of a butylated benzoguanamine-formaldehyde resin.

EXAMPLE 1

A copper-clad laminate coated with RISTON 3415 aqueous developable photoresist which has been imaged and developed to form a pattern in the photoresist, is dipped into a bath containing a solution of Resin I (100 parts) and aqueous 20 % lactic acid (6 parts) in water (494 parts) for 5 minutes. The laminate is then removed from the bath and wiped to remove excess resin solution. It is then dried at 120° C. for 10 minutes. The laminate is then immersed in an aqueous 20% solution of HOECHST HB 1160 DRY FILM STRIPPER at 50° C. This treatment removes the photoresist but leaves the dip coating. The copper exposed by removing the photoresist is etched away in a 36% solution of ferric chloride at 30° C., after which the laminate is washed in water and dried, to leave a pattern, in copper covered with dip film, on the laminate base. Immersion in a mixture of propylene carbonate (50 pars), gamma-butyrolactone (20 parts) and butyl digol (30 parts) removes the dip film to leave a copper pattern on the laminate base.

EXAMPLE 2

A copper-clad laminate coated with RISTON 3415 aqueous developable photoresist which has been imaged and developed to form a pattern in the photoresist, is dipped into a bath containing a solution of Resin II (200 parts) and aqueous 20% lactic acid (13.44 parts) in water (386.56 parts) for 2 minutes. The laminate is then removed from the bath and wiped to remove excess resin solution. It is then dried at 120° C. for 10 minutes. The laminate is then immersed in an aqueous 20% solution of HOECHST HB 1160 DRY FILM STRIPPER at 50° C. This treatment removes the photoresist but leaves the dip coating. The copper exposed by removing the photoresist is etched away in a 36% solution of ferric chloride at 30° C., after which the laminate is washed in water and dried, to leave a pattern, in copper covered with dip film, on the laminate base. Immersion in a mixture of propylene carbonate (50 parts), gamma-butyrolactone (20 parts) and butyl digol (30 parts) removes the dip film to leave a copper pattern on the laminate base.

EXAMPLE 3

A copper-clad laminate coated with RISTON 3415 aqueous developable photoresist which has been imaged and developed to form a pattern in the photoresist, is dipped into a bath containing a solution of Resin II (100 parts) in 2-n-butoxyethanol (500 parts) for 5 minutes. The laminate is then removed from the bath and wiped to remove excess resin solution. It is then dried at 120° C. for 10 minutes. The laminate is then immersed in an aqueous 20% solution of HOECHST HB 1160 DRY FILM STRIPPER at 50° C. This treatment removes the photoresist but leaves the dip coating. The copper exposed by removing the photoresist is etched away in a 36% solution of ferric chloride at 30° C., after which the laminate is washed in water and dried, to leave a pattern, in copper covered with dip film, on the laminate base. Immersion in 2-n-butoxyethanol removes the dip film to leave a copper pattern on the laminate base.

EXAMPLE 4

A copper-clad laminate coated with RISTON 3415 aqueous developable photoresist which has been imaged and developed to form a pattern in the photoresist, is dipped into a bath containing a solution of Resin III (50 parts) in a 5:1 w/w mixture of toluene and 2-n-butoxyethanol (950 parts) for one and half minutes. The laminate is then removed from the bath and wiped to remove excess resin solution. It is then dried at 150° C. for 10 minutes. The laminate is then immersed in an aqueous 10% solution of ROBERTSON 279H DRY FILM STRIPPER at 50° C. This treatment removes the photoresist but leaves the dip coating. The copper exposed by removing the photoresist is etched away in a 36% solution of ferric chloride at 30° C., after which the laminate is washed in water and dried, to leave a pattern, in copper covered with dip film, on the laminate base. Immersion in 2-n-butoxyethanol removes the dip film to leave a coppr pattern on the laminate base.

EXAMPLE 5

A copper-clad laminate coated with RISTON 3415 aqueous developable photoresist which has been imaged and developed to form a pattern in the photoresist, is dipped into a bath containing a solution of Resin 4 (100 parts) and aqueous 20% lactic acid (19.1 parts) in water (410.9 parts) for 5 minutes. The laminate is then removed from the bath and wiped to remove excess resin solution. It is then dried at 150° C. for 10 minutes. The laminate is immersed in an aqueous 10% solution of ROBERTSON 279H DRY FILM STRIPPER at 50° C. This treatment removes the photoresist but leaves the dip coating. The copper exposed by removing the photoresist is etched away in a 36% solution of ferric chloride at 30° C., after which the laminate is washed in water and dried, to leave a pattern, in copper covered with dip film, on the laminate base. Immersion in a mixture of propylene carbonate (50 parts), gamma-butyrolactone (20 parts) and butyl digol (30 parts) removes the dip film to leave a copper pattern on the laminate base.

EXAMPLE 6

A copper-clad laminate coated with RISTON 3415 aqueous developable photoresist which has been imaged and developed to form a pattern in the photoresist, is dipped into a bath containing a solution of Resin V (100 parts) and Suprasec MPR blocked with methyl ethyl ketoxime (10 parts) in a mixture of toluene (800 parts) and 2-n-butoxyethanol (100 parts) for 1 minute. The laminate is then removed from the bath and wiped to remove excess resin solution. It is then dried at 150° C. for 10 minutes. The laminate is immersed in an aqueous 20% solution of HOECHST HB 1160 DRY FILM STRIPPER at 50° C. This treatment removes the photoresist but leaves the dip coating. The copper exposed by removing the photoresist is etched away in a 36% solution of ferric chloride at 30° C., after which the laminate is washed in water and dried, to leave a pattern, in copper covered with dip film, on the laminate base. Immersion in a mixture of propylene carbonate (50 parts), gamma-butyrolactone (20 parts) and butyl digol (30 parts) removes the dip film to leave a copper pattern on the laminate base.

EXAMPLE 7

A copper-clad laminate coated with RISTON 3415 aqueous developable photoresist which has been imaged and developed to form a pattern in the photoresist, is dipped into a bath containing a mixture of Resin VI (100 parts), and a mixture of triphenylsulphonium hexafluoroantimonate (4 parts) and 9-methylanthracene (1 part) for 1 minute. The laminate is then removed from the bath and wiped to remove excess resin. It is then exposed to ultra-violet light from a metal-halide lamp at a distance of 75 cm for 2 minutes. The laminate is then immersed in an aqueous 20% solution of HOECHST HB 1160 DRY FILM STRIPPER at 50° C. This treatment removes the photoresist but leaves the dip coating. The copper exposed by removing the photoresist is etched away in a 36% solution of ferric chloride at 30° C., after which the laminate is washed in water and dried, to leave a pattern, in copper covered with dip film, on the laminate base. Immersion in a mixture of propylene carbonate (50 parts), gamma-butyrolactone (20 parts) and butyl digol (30 parts) removes the dip film to leave a copper pattern on the laminate base.

EXAMPLE 8

A copper-clad laminate coated with RISTON 3415 aqueous developable photoresist which has been imaged and developed to form a pattern in the photoresist, is dipped into a bath containing a mixture of Resin VII (200 parts) in toluene (400 parts) for 2 minutes. The laminate is then removed from the bath and wiped to remove excess resin solution. It is then dried at 120° C. for 10 minutes. The laminate is then immersed in an aqueous 20% solution of HOECHST HB 1160 DRY FILM STRIPPER at 50° C. This treatment removes the photoresist but leaves the dip coating. The copper exposed by removing the photoresist is etched away in a 36% solution of ferric chloride at 30° C., after which the laminate is washed in water and dried, to leave a pattern, in copper covered with dip film, on the laminate base. Immersion in a mixture of propylene carbonate (50 parts), gamma-butyrolactone (20 parts) and butyl digol (30 parts) removes the dip film to leave a copper pattern on the laminate base.

EXAMPLE 9

A copper-clad laminate coated with RISTON 3415 aqueous developable photoresist which has been imaged and developed to form a pattern in the photoresist, is dipped into a bath containing a mixture of Resin VIII (200 parts) and aqueous 20% lactic acid (13.68 parts) in water (586.32 parts) for 5 minutes. The laminate is then removed from the bath and wiped to remove excess resin solution. It is then dried at 120° C. for 10 minutes. The laminate is then immersed in an aqueous 20% solution of HOECHST HN 1160 DRY FILM STRIPPER at 50° C. This treatment removes the photoresist but leaves the dip coating. The copper exposed by removing the photoresist is etched away in a 36% solution of ferric chloride at 30° C., after which the laminate is washed in water and dried, to leave a pattern, in copper covered with dip film, on the laminate base. Immersion in a mixture of propylene carbonate (50 parts), gamma-butyrolactone (20 parts) and butyl digol (30 parts) removes the dip film to leave a copper pattern on the laminate base.

EXAMPLE 10

A copper-clad laminate coated with RISTON 3415 aqueous developable photoresist which has been imaged and developed to form a pattern in the photoresist, is dipped into a bath containing a mixture of Resin I (100 parts), Suprasec MPR blocked with methyl ethyl ketoxime (3.7 parts) and aqueous 20% lactic acid (6.7 parts) in a mixture of 2-n-butoxyethanol (4 parts) and water (258 parts) for 5 minutes. The laminate is then removed from the bath and wiped to remove excess resin solution. It is then dried at 120° C. for 10 minutes. The laminate is then immersed in an aqueous 20% solution of HOECHST HB 1160 DRY FILM STRIPPER at 50° C. This treatment removes the photoresist but leaves the dip coating. The copper exposed by removing the photoresist is etched away in a 36% solution of ferric chloride at 30° C., after which the laminate is washed in water and dried, to leave a pattern, in copper covered with dip film, on the laminate base. Immersion in a mixture of propylene carbonate (50 parts), gamma-butyrolactone (20 parts) and butyl digol (30 parts) removes the dip film to leave a copper pattern on the laminate base.

EXAMPLE 11

A copper-clad laminate coated with RISTON 3415 aqueous developable photoresist which has been imaged and developed to form a pattern in the photoresist, is dipped into a bath containing a mixture of Resin IX (100 parts) in 1-methyl-2-pyrrolidinone (900 parts) for 15 seconds. The laminate is then removed from the bath and wiped to remove excess resin solution. It is then dried at 150° C. for 10 minutes. The laminate is then immersed in an aqueous 20% solution of HOECHST HB 1160 DRY FILM STRIPPER at 50° C. This treatment removes the photoresist but leaves the dip coating. The copper exposed by removing the photoresist is etched away in a 36% solution of ferric chloride at 30° C., after which the laminate is washed in water and dried, to leave a pattern, in copper covered with dip film, on the laminate base. Immersion in 1-methyl-2-pyrrolidinone removes the dip film to leave a copper pattern on the laminate base.

EXAMPLE 12

A copper-clad laminate coated with RISTON 3415 aqueous developable photoresist which has been imaged and developed to form a pattern in the photoresist, is dipped into a bath containing a mixture of Resin II (100 parts), Resin X (12 parts), 20% aqueous lactic acid (13.5 parts) and 10% aqueous solution of the morpholine salt of p-toluene sulphonic acid (12 parts) in water (162.5 parts) for 5 minutes. The laminate is then removed from the bath and wiped to remove excess resin solution. It is then dried at 120° C. for 10 minutes. The laminate is then immersed in an aqueous 20% solution of HOECHST HE 1160 DRY FILM STRIPPER at 50° C. This treatment removes the photoresist but leaves the dip coating. The copper exposed by removing the photoresist is etched away in a 36% solution of ferric chloride at 30° C., after which the laminate is washed in water and dried, to leave a pattern, in copper covered with dip film, on the laminate base. Immersion in a mixture of propylene carbonate (50 parts), gamma-butyrolactone (20 parts) and butyl digol (30 parts) removes the dip film to leave a copper pattern on the laminate base.

EXAMPLE 13

A copper-clad laminate coated with RISTON 3415 aqueous developable photoresist which has been imaged and developed to form a pattern in the photoresist, is dipped into a bath containing a mixture of Resin XI (100 parts) in methanol (226.5 parts) for 30 seconds. The laminate is then removed from the bath and wiped to remove excess resin solution. It is then dried at 120° C. for 10 minutes. The laminate is then immersed in an aqueous 20% solution of HOECHST HB 1160 DRY FILM STRIPPER at 50° C. This treatment removes the photoresist but leaves the dip coating. The copper exposed by removing the photoresist is etched away in a 36% solution of ferric chloride at 30° C., after which the laminate is ashed in water and dried, to leave a pattern, in copper covered with dip film, on the laminate base. Immersion in a mixture of propylene carbonate (50 parts), gamma-butyrolactone (20 parts) and butyl digol (30 parts) removes the dip film to leave a copper pattern on the laminate base.

EXAMPLE 14

A copper-clad laminate coated with RISTON 3415 aqueous developable photoresist which has been imaged and developed to form a pattern in the photoresist, is dipped into a bath containing a mixture of Resin XII (100 parts), Resin XIII (17.2 parts), morpholine salt of p-toluenesulphonic acid (10% aqueous solution, 12 parts) and 20% aqueous lactic acid (13.5 parts) in water (157.5 parts) for 5 minutes. The laminate is then removed from the bath and wiped to remove excess resin solution. It is then dried at 120° C. for 10 minutes. The laminate is then immersed in an aqeuous 20% solution of HOECHST HB 1160 DRY FILM STRIPPER at 50° C. This treatment removes the photoresist but leaves the dip coating. The copper exposed by removing the photoresist.is etched away in a 36% solution of ferric chloride at 30° C., after which the laminate is washed in water and dried, to leave a pattern, in copper covered with dip film, on the laminate base. Immersion in a mixture of propylene carbonate (50 parts), gamma-butyrolactone (20 parts) and butyl digol (30 parts) removes the dip film to leave a copper pattern on the laminate base.

EXAMPLE 15

A copper-clad laminate coated with RISTON 3415 aqueous developable photoresist which has been imaged and developed to form a pattern in the photoresist, is dipped into a bath containing a mixture of Resin II (100 parts), TRIXENE SC 796 (a fully-blocked isocyanate from Bazenden Chemicals Ltd., 7.2 parts), 20% aqueous solution of lactic acid (6.7 parts) and water (485.6 parts) for 5 minutes. The laminate is then removed from the bath and wiped to remove excess resin solution. It is then dried at 120° C. for 10 minutes. The laminate is then immersed in an aqeuous 20% solution of HOECHST HB 1160 DRY FILM STRIPPER at 50° C. This treatment removes the photoresist but leaves the dip coating. The copper exposed by removing the photoresist is etched away in a 36% solution of ferric chloride at 30° C., after which the laminate is washed in water and dried, to leave a pattern, in copper covered with dip film, on the laminate base. This is then over coated with a 10:1 w/w. mixture of PROBIMER 52 and Hardener 31. The coated panel is dried at 80° C. for 10 minutes and then irradiated via a mask. Immersion in a mixture of propylene carbonate (50 parts), gamma-butyrolactone (20 parts) and butyldigol (30 parts) removes the areas of PROBIMER which have not been exposed to UV light and the dip film beneath these areas.

We claim:

1. A method for making a metallic pattern on a substrate having a surface comprising bare metal in predetermined areas and metal coated by a resist in remaining areas which comprises (i) protecting the bare metal with a film-forming resin, which resin is applied by dipping, rolling, brushing or spraying, (ii) removing any film-forming resin from the resist, (iii) removing the resist from said remaining areas using a solvent which will not remove the film-forming resin, thereby exposing metal in said remaining areas, (iv) etching the metal exposed in (iii) using an etchant which does not remove the film-forming resin and (v) removing the film-forming resin with a suitable solvent.

2. A method as claimed in claim 1, in which the resist is a photoresist which is strippable under aqueous conditions or by means of an organic solvent.

3. A method as claimed in claim 2, in which the photoresist is strippable under aqueous conditions and the film-forming resin is strippable by means of an organic solvent.

4. A method as claimed in claim 1, in which the film-forming resin is an acrylic resin; an epoxy resin; an adduct of an epoxide resin with an amine, a polycarboxylic acid or anhydride, an aminocarboxylic acid or a mercaptocarboxylic acid; a polyurethane; a polyester; or a reaction product of a phenolic hydroxyl group-containing resin with an aldehyde and an amine or an amino- or mercaptocarboxylic acid.

5. A method as claimed in claim 4, in which the film-forming resin is a copolymer of at least one monoacrylic ester with at least one monoacrylic monomer containing a carboxyl or tertiary amino group and, optionally, with a further vinyl monomer.

6. A method as claimed in claim 4, in which the film-forming resin is an adduct of a diglycidyl ether of a bisphenol, which may have been advanced, with an amine.

7. A method as claimed in claim 1, in which the metallic pattern is a printed circuit and the metal is copper.

8. A method as claimed in claim 1, in which the film-forming resin is removed from the resist by wiping or by passing the substrate through rollers.

9. A method as claimed in claim 1, in which the film-forming resin is dried, heat cured or light cured before step (iii).

10. A method of making a metallic pattern on a substrate having a surface comprising bare metal in predetermined areas and metal coated by a first resist in remaining areas which comprises (i) protecting the bare metal with a film-forming resin, which resin is applied by dipping, rolling, brushing or spraying, (ii) removing any film-forming resin from the first resist, (iii) removing the first resist from said remaining areas using a solvent which does not remove the film-forming resin, (iv) etching the metal exposed in (iii) using an etchant which does not remove the film-forming resin, (v) forming a layer of a second resist in a predetermined pattern over the film-forming resin, thereby leaving areas of the film-forming resin film uncovered by the resist, and (vi) removing the uncovered areas of the film-forming resin by treatment with a solvent therefor.

11. A method as claimed in claim 10, in which the first resist is a photoresist.

12. A method as claimed in claim 11, in which the photoresist is strippable under aqueous conditions in step (ii) and the film-forming resin is strippable by means of an organic solvent in step (vi).

13. A method as claimed in claim 10, in which the film-forming resin is dried, heat cured or light cured before step (iii).

14. A method as claimed in claim 10, in which step (v) is effected by applying a curable composition over the film-forming resin directly in a predetermined pattern by screen printing and curing the curable composition.

15. A method as claimed in claim 10, in which step (v) is effected by (a) applying a layer of a photoresist over the film-forming resin (b) irradiating the photoresist layer in a predetermined pattern, thereby effecting a difference in solubility between exposed and unexposed parts of the layer, and (c) removing more soluble parts of the irradiated layer by treatment with a solvent.

16. A method as claimed in claim 15, in which the photoresist is a negative photoresist.

17. A method as claimed in claim 16, in which the photoresist is a solder mask.

18. A method as claimed in claim 15, in which irradiation in step (v) (b) is effected using electromagnetic radiation of wavelength 200-600 nm.

19. A method as claimed in claim 15, in which the removal (vi) of the film-forming resin is effected by the solvent treatment (v) (c).

20. A method as claimed in claim 10, in which the first resist is removed by an aqueous solvent, the second resist is removed by means of an organic solvent and the film-forming resin is removed by means of an organic solvent used to remove the second resist.

* * * * *